United States Patent [19]
Thayer et al.

[11] Patent Number: 5,598,119
[45] Date of Patent: Jan. 28, 1997

[54] METHOD AND APPARATUS FOR A LOAD ADAPTIVE PAD DRIVER

[75] Inventors: Billy E. Thayer; Scott A. Linn, both of Corvallis, Oreg.

[73] Assignee: Hewlett-Packard Company, Palo Alto, Calif.

[21] Appl. No.: 417,335

[22] Filed: Apr. 5, 1995

[51] Int. Cl.[6] ........................... H03K 17/687; H03K 3/01
[52] U.S. Cl. ........................ 327/111; 327/379; 326/83
[58] Field of Search ............................ 327/134, 108, 327/109, 111, 112, 379, 380; 326/82, 83, 33, 21, 26, 27

[56] References Cited

U.S. PATENT DOCUMENTS

| | | | |
|---|---|---|---|
| 4,567,378 | 1/1986 | Raver | 307/270 |
| 4,825,099 | 4/1989 | Barton | 307/270 |
| 4,906,867 | 3/1990 | Petty | 326/83 |
| 5,039,874 | 8/1991 | Anderson | 307/270 |
| 5,140,591 | 8/1992 | Palara et al. | 327/109 |
| 5,166,558 | 11/1992 | Ohsawa | 326/83 |
| 5,237,213 | 8/1993 | Tanoi | 327/379 |
| 5,300,830 | 4/1994 | Hawes | 307/465 |

FOREIGN PATENT DOCUMENTS

| | | | |
|---|---|---|---|
| 0422391 | 9/1990 | European Pat. Off. | H03K 90/185 |
| 542227 | 5/1993 | European Pat. Off. | 326/33 |
| 0591750 | 9/1993 | European Pat. Off. | 19/3 |
| WO91/20129 | 12/1991 | WIPO | H03K 19/003 |

*Primary Examiner*—Timothy P. Callahan
*Assistant Examiner*—Eunja Shin

[57] ABSTRACT

A load adaptive pad driver for integrated circuits provides a substantially constant speed output at the pad regardless of the load connected to the pad. A reference slope signal, based on variables such as fabrication process, and operational voltage and temperature ranges and biased to give a substantially flat response, is compared to the signal output of a resistive-based pad driver circuit. When a transition between output signal levels provided by the pad driver circuit is slower than the reference signal slope, an auxiliary driver circuit is used to compensate. Electromagnetic interference is also reduced via said load adaptive pad driver.

6 Claims, 5 Drawing Sheets

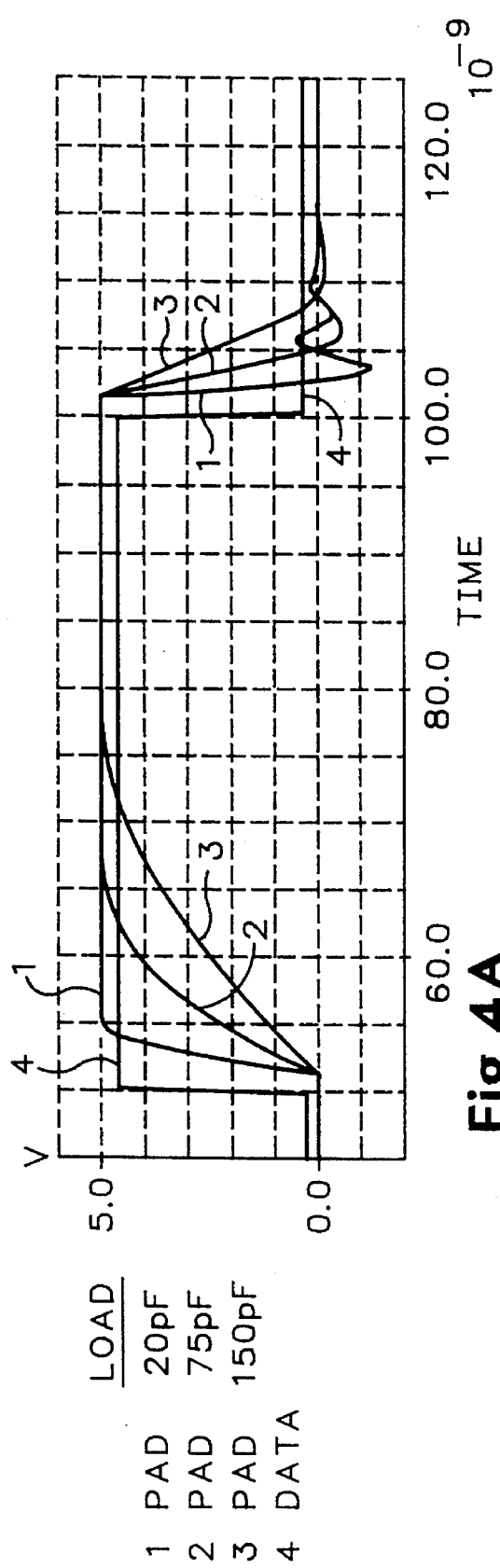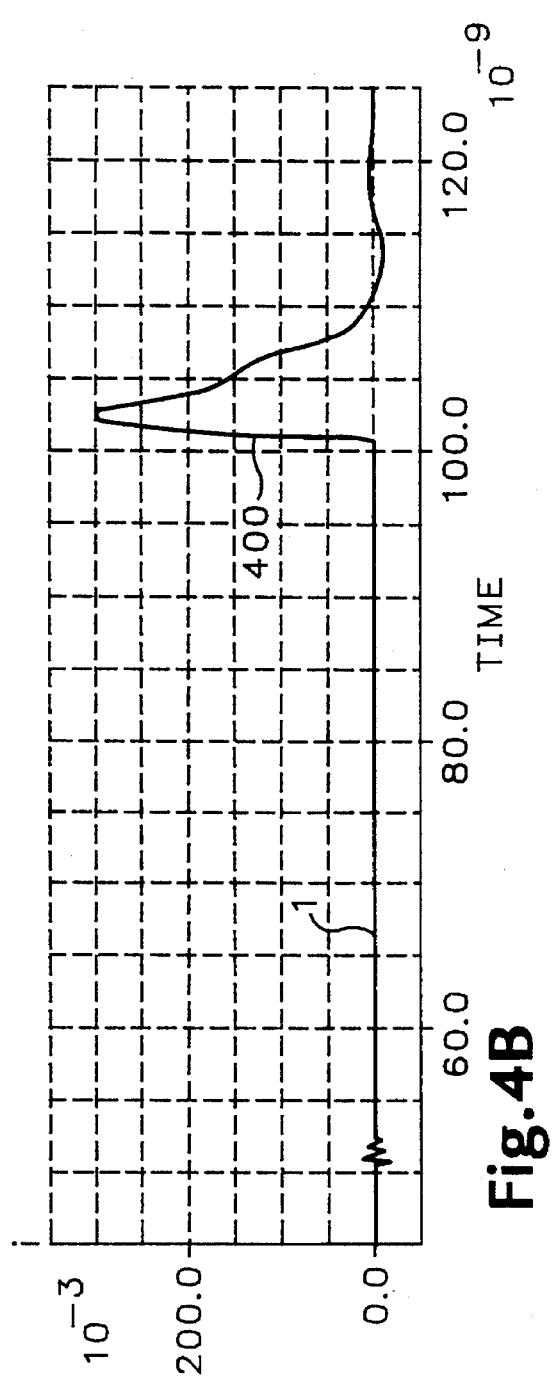
Fig.4A
Fig.4B

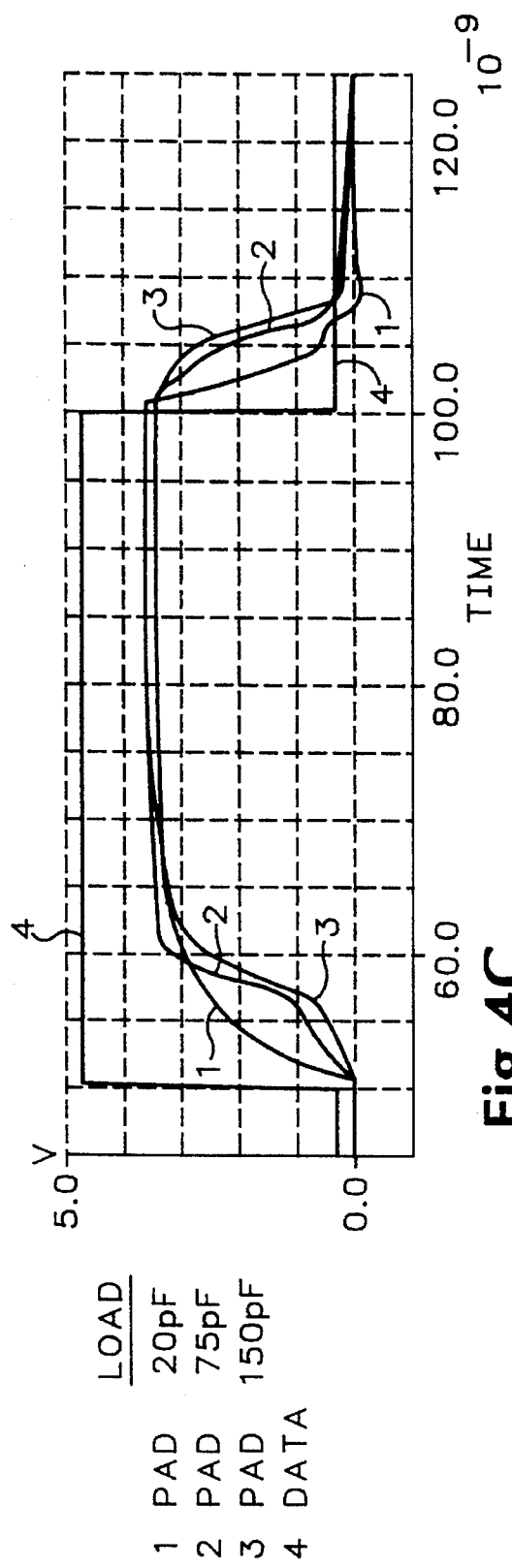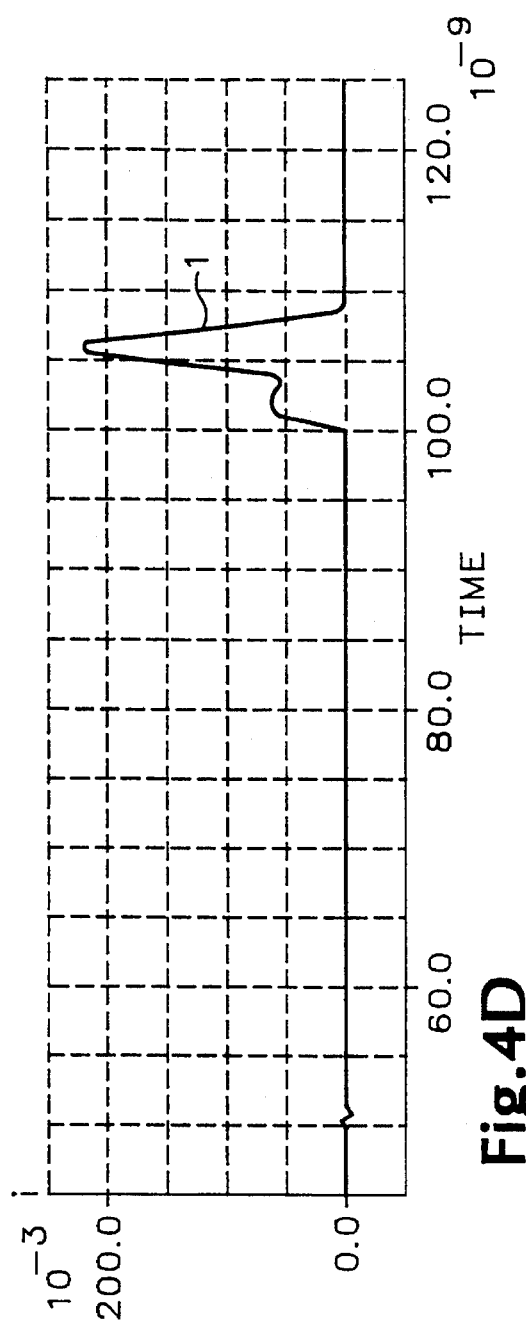
Fig. 4C
Fig. 4D

METHOD AND APPARATUS FOR A LOAD ADAPTIVE PAD DRIVER

BACKGROUND OF THE INVENTION

1. Field of the Invention

The present invention generally relates to integrated circuit (IC) output pad driving circuitry and, more specifically, to a method and apparatus for a load adaptive pad driver for integrated circuits.

2. Description of the Related Art

Digital logic integrated circuits—also known as "die" and "chips"—such as microprocessors and memories, generate output signals as either a HIGH logic state, sometimes referred to as a "1," or a LOW logic state, sometimes referred to as a "0." Each logic state output signal is a predetermined, steady-state, signal level, for example, five volts DC for HIGH and zero volts for LOW. Typically, an IC output driver stage includes field effect transistors (FET) connected in series through a resistor to a selected IC output terminal, referred to as the "pad." This prior art is shown in FIG. 1. The logical signal to be output, "DATA," is applied to the gates of the FETs and, along with an OUTPUT ENABLE signal for the specified pad, drive the output pad. That is, it is the function of the output driver to switch the pad between data output signal levels. This basic output driver circuit is designed to have an output resistance of 10 to 100 ohms and to have driver FETs that are relatively small. In this case, this circuit is designed to drive a minimum load capacitance at or near to the design specification speed.

While the task seems simple enough, in state-of-the-art of integrated circuit fabrication technology where transistor gates are measured in a fraction of a micron, many factors affect operations, including the process used for fabrication (e.g., bipolar vs. CMOS, 0.5 micron vs. 0.35 micron, and the like), voltage and current loads, electrostatic discharge (ESD) surges, operating temperatures, load capacitance, and the like. When there is a current transition, di/dt, in a chip, electromagnetic inductive noise (EMI) is generated. When there are a large number of pads on the chip, there can be a large inductance in the chip's ground bus. When the signal on a number of pads switches state simultaneously, a large noise spike in the ground line occurs. Therefore, the system architecture designer must account for such contingencies in constructing output drivers.

For example, noise on chip pads is addressed by U.S. Pat. No. 5,039,874 (Anderson; assigned to the common assignee of the present invention) by selectively adding a second driver to increase signal transition speed on the output pad. Current surge problems are addressed by U.S. Pat. No. 4,825,099 (Barton) by using a controllably switched current mirror circuit. Prevention of load current peaks is addressed in EP 591750 (DE4233850) in which the pad is driven as a current controlled element during a first range of the output transistor output voltage and as a voltage controlled element during a second voltage range. However, none of these methodologies provide an active feedback with respect to determining whether output load conditions require auxiliary pad driving during an output pad signal transition between a HIGH and LOW data output signal level.

Therefore, there is a need for a load adaptive pad driver apparatus that will generate a substantially constant output signal transition speed at an IC output pad regardless of the load attached to any specific pad on the chip.

SUMMARY OF THE INVENTION

In its basic aspects, the present invention provides an apparatus for driving an integrated circuit output pad in response to a data output signal that switches between a first data signal having a first predetermined value and second data signal having a second predetermined value, the pad having a load connected thereto. The apparatus includes: a first driver, having an input connected for receiving the data signals, and an output for transmitting the data signals to the pad such that the pad switches from the first data signal to the second data signal and from the second data signal to the first data signal at a rate of transition at the pad that is dependent upon the load; signal generator circuitry for generating a predetermined reference signal having a slope such that the slope is positive-going when the data signal transition is positive-going and is negative-going when the data signal transition is negative-going; comparator circuitry, having a first input connected to the signal generator and a second input coupled to the first driver, for comparing the slope of the predetermined reference signal to the rate of transition of a switching data signal at the pad; and second driver, having an input coupled to the comparator and an output coupled to the pad, for driving the pad at a rate dependent upon the reference signal when the rate of transition is slower than the slope of the reference signal.

Further, the invention includes a method for driving an integrated circuit output pad responsive to an integrated circuit data output signal which switches between a first logic state level representative of a "1" and a second logic state level representative of a "0," including the steps of: comparing a data output signal to a predetermined reference signal having a predetermined rate of transition; driving said output pad with said data output signal when said data output signal level rate of transition between said logic state levels is greater than or equal to said predetermined reference signal rate of transition; and driving said output pad with said predetermined reference signal when said data output signal level rate of transition between said logic state levels is less than said predetermined reference signal rate of transition.

It is an advantage of the present invention that it will provide a substantially constant output speed as a pad driver for a large range of capacitive loads.

It is another advantage of the present invention that it will reduce EMI conductance when the pad is in a steady state.

It is another advantage of the present invention that output speed will be substantially compensated for process, voltage, and temperature variations.

It is yet another advantage of the present invention that at a point where the pad voltage is near the supply limit values, namely the chips bias voltage, $V_{DD}$, and ground, the output will be resistive and the current will be low, resulting in a reduction of ringing at the finish of the transition.

It is still another advantage of the present invention that di/dt will be less than other designs, leading to less EMI.

Other objects, features and advantages of the present invention will become apparent upon consideration of the following detailed description and accompanying drawings, in which like reference designations represent like features throughout the FIGURES.

DESCRIPTION OF THE DRAWINGS

FIGS. 4A–D are waveform diagrams for comparison of a typical output driver circuit output transition against the load adaptive pad driver circuit of the present invention as shown in FIG. 2 in which:

FIG. 4A is the pad voltage transition for a typical output driver circuit as shown in FIG. 1 for three different capacitive loads, FIG. 4B is the ground current waveform for the transitions shown in FIG. 4A, FIG. 4C is the pad voltage transition for an load adaptive pad driver of the present invention as shown in FIG. 3A–B, and FIG. 4D is the ground current waveform for the transitions shown in FIG. 4C.

The drawings provided with this description should be understood as not being drawn to scale except if specifically noted.

DETAILED DESCRIPTION OF THE INVENTION

Reference is made now in detail to a specific embodiment of the present invention, which illustrates the best mode presently contemplated by the inventor(s) for practicing the invention. Alternative embodiments are also briefly described where applicable.

Figure 1:
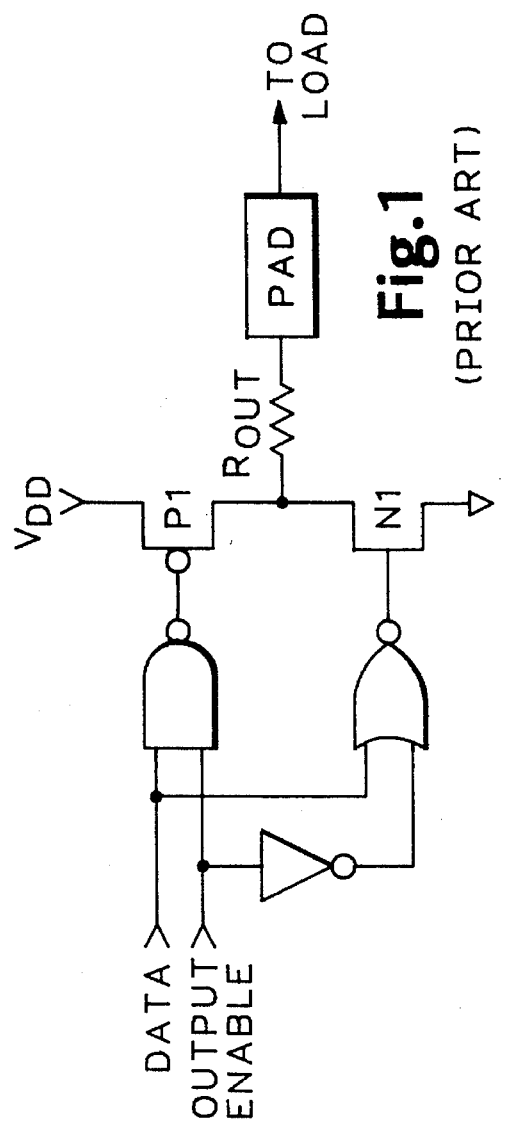
FIG. 1 (Prior Art) is a typical output driver circuit for an integrated circuit pad.
Figure 2:
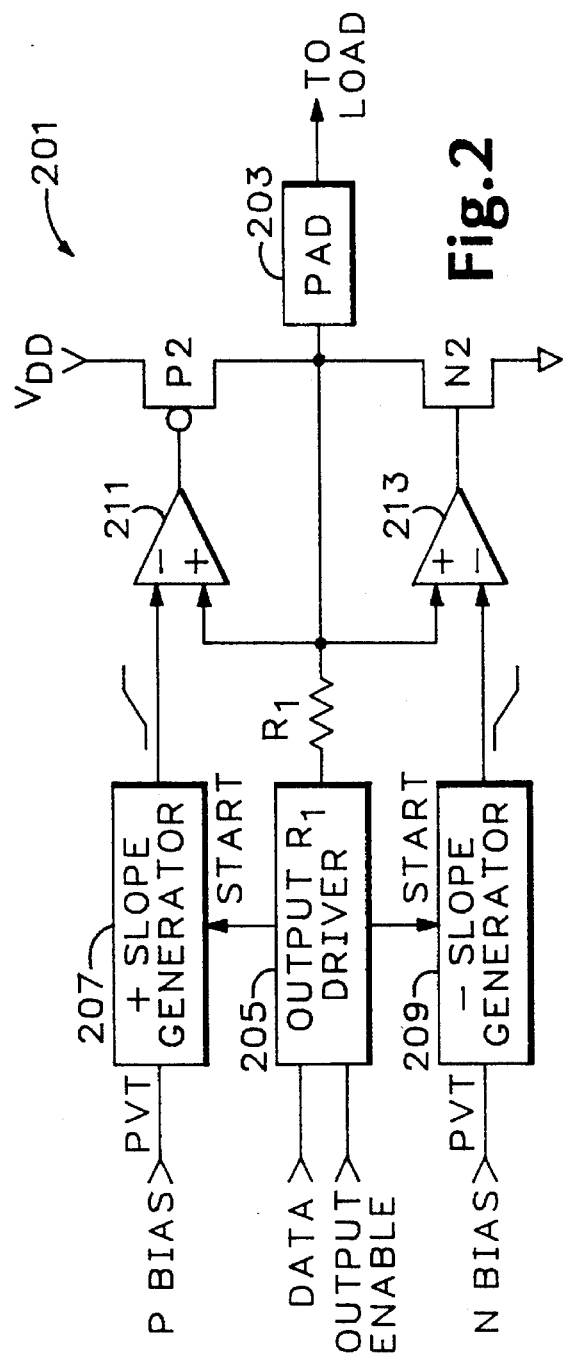
FIG. 2 is a schematic diagram of the apparatus of the present invention.

FIG. 2 depicts a load adaptive integrated circuit output pad driver apparatus 201 in accordance with the present invention. On a chip, a number of integrated circuit output pads 203 will be coupled to specific loads. The loads may have a range of capacitive values, e.g., 10 to 140 picofarads (pF). A resistive-based output driver circuit 205 includes an output resistor $R_1$ (see FIG. 1 for detail of the output driver circuit 205, where $R_1=R_{OUT}$). Because the loads connected to each pad may vary, an output driver circuit 205 is designed to drive the pad 203 for the minimum capacitive load and at the slowest speed. That is, when a DATA transition and OUTPUT ENABLE signals are input to the output driver circuit 205, the output driver circuit 205 will tend to drive the pad 203 in accordance with its design for the minimum load of the range. When the load capacitance is larger, the output driver circuit 205 will still drive at the same strength; that is, it will not adapt each pad in accordance with the specific load attached to that pad. The apparatus 201 of the present invention includes the needed adaptive capability by providing a reference slope signal generator, used to provide a signal having a predetermined reference signal output to compare to the rate of transition of the DATA output signal at the pad 203 (which will be dependent upon the load) to the slope of the reference signal.

In the embodiment shown in FIG. 2, the signal to the gates of each of the FETs of the output driver circuit 205 are respectively coupled to a positive-going, reference slope signal generator 207 (to $P_1$ gate) and a negative-going, reference slope signal generator 209 (to $N_1$ gate). Thus, during an OUTPUT ENABLE and DATA transition event, one of the slope signal generators 207, 209 receives a START signal; namely the positive-going, reference slope signal generator 207 is triggered when it receives the START signal when the pad 203 is to transit from a LOW to a HIGH output state and the negative-going, reference slope signal generator 209 receives the START signal when the pad 203 is to transit from a HIGH to a LOW output state. It has been found that the output at the pad 203 can be substantially normalized if each slope signal generator 207, 209 is provided with a process, voltage, and temperature (PVT) bias signal. The purpose of the PVT bias inputs is so that the reference slope signal that is generated will have the same slope, or "speed" of transition, regardless of the process and voltage in which the chip was designed and for environmental operating temperature changes. That is, the PVT bias is predetermined such that the signal generator will give a flat response regardless of the process of fabrication, the voltage levels employed, and the operational temperature. While, as it will be recognized by a person skilled in the art, there are many possible implementations for generating the PVT bias, it is suggested that this reference slope signal be generated by having the PVT bias generate a constant current to discharge a fairly large gate capacitance. Thus, the reference slope signal will generate a standard slope voltage, starting at Vdd or ground and ending at the other supply voltage in a predetermined time from the start signal.

The output PAD 203 signal and the output of the appropriately selected slope signal generator 207 or 209 are routed to a comparator 211 (for generator 207), 213 (for generator 209), respectively. That is, for a LOW to HIGH transition, comparator 211 compares the reference slope signal from positive-going slope signal generator 207 to the signal transition occurring at the PAD (203); for a HIGH to LOW transition, comparator 213 compare the reference slope signal from negative-going slope signal generator 209 to the signal transition occurring at PAD.

The comparators are tied to an auxiliary output driver that is connected to the pad 203. The output of comparator 211 is fed to the gate of a FET $P_2$. The source of FET $P_2$ is connected to the circuit bias voltage, $V_{DD}$ and the drain of the FET $P_2$ is connected to the input of pad 203. The output of comparator 213 is fed to the gate of a FET $N_2$. The source of FET $N_2$ is connected to the circuit ground and the drain of the FET $N_2$ is connected to the input of pad 203. FETs $P_2$ and $N_2$ are relatively large in comparison to the FETs $P_1$ and $N_1$ of the output driver circuit 205 (see also FIG. 1), for example, by a factor of 3 or 10 times. Thus, note that because FETs $P_2$ and $N_2$ are much larger, and therefore require more input to turn on, when the pad 203 is pulling through resistor $R_1$ and transiting between digital output levels at the same rate as the signal output of a signal generator 207, 209 as determined by a comparator 211,213, the FETs $P_2$ or $N_2$ will not turn on.

When the load capacitance is larger than the minimum for which the output driver circuit 205 is designed, namely, where the output driver circuit 205 will not drive the pad transition fast enough—namely, as fast as it would with the minimum design loads—the comparators 211, 213 will drive their respective FETs $P_2$, $N_2$ to assure that the slope of the pad 203 transition matches the slope of the reference slope generated by the applicable slope generator 207, 209, respectively. The comparators 211, 213 can be P-type transistors having a source and substrate tied to the most positive of the two signals to be compared. This will allow the comparator transistor to turn on when the pad voltage lags the reference slope; this can be amplified to drive the appropriate FET $P_2$ or $N_2$. The design of the comparators 211, 213 is such that at the point where the pad 205 voltage is approaching a difference of one volt from the supply limit ($V_{DD}$ or ground), the output will start to turn off the large FET $P_2$ or $N_2$ and at approximately 0.6 volt from the supply limit, the large FET will be completely off, leaving the task of pulling the pad voltage the rest of the way to the supply limit to the output driver 205. In addition to adapting the pad transition speed to match the load, this feature allows the current required to switch the pad 203 to reach a very small value before the pad is at zero volts, thereby greatly reducing ringing at the end of the transition.

Figure 3A:
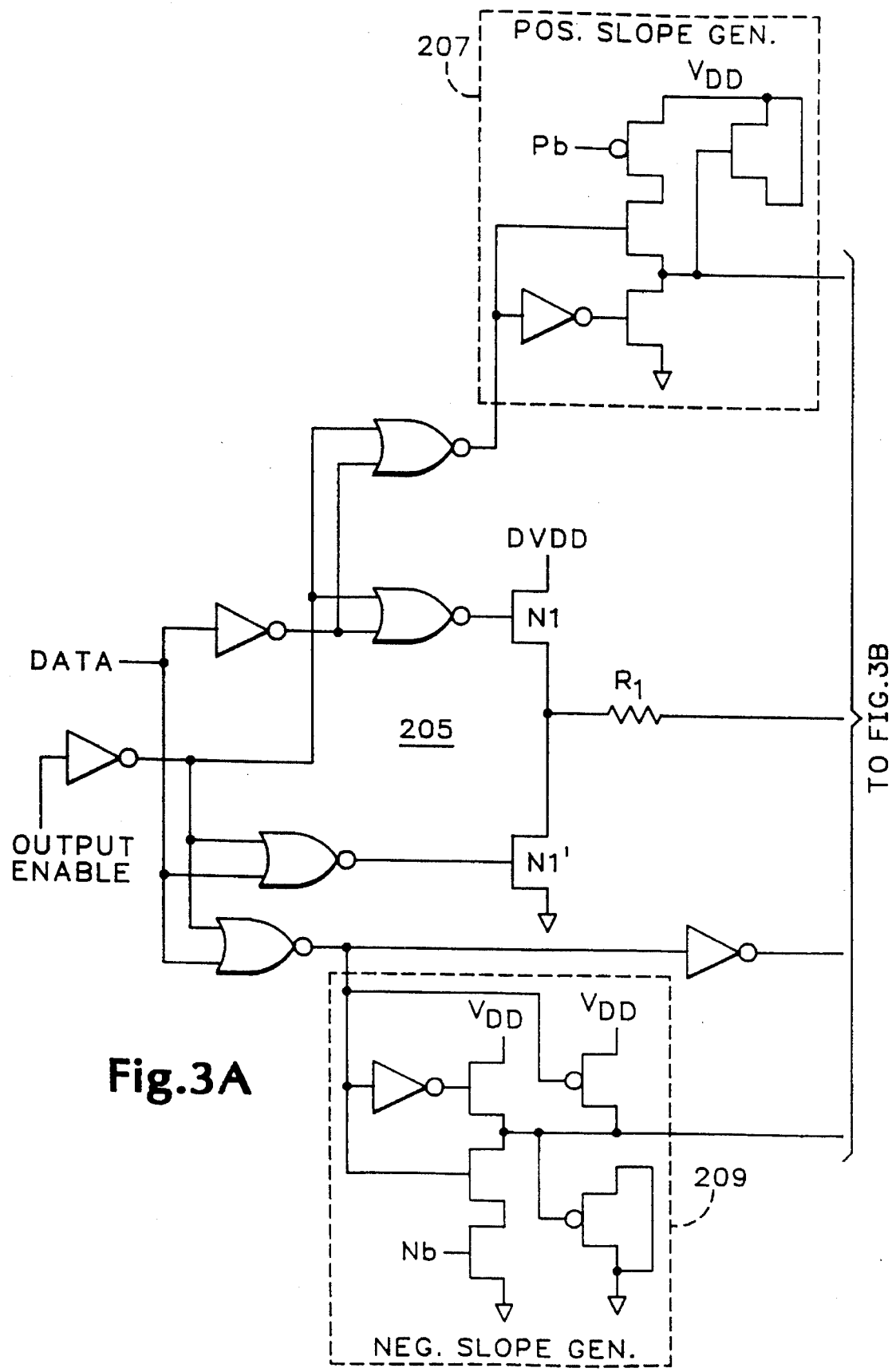
FIGS. 3A–B is a schematic diagram of an alternative embodiment of the present invention as shown in FIG. 2.
Figure 3B:
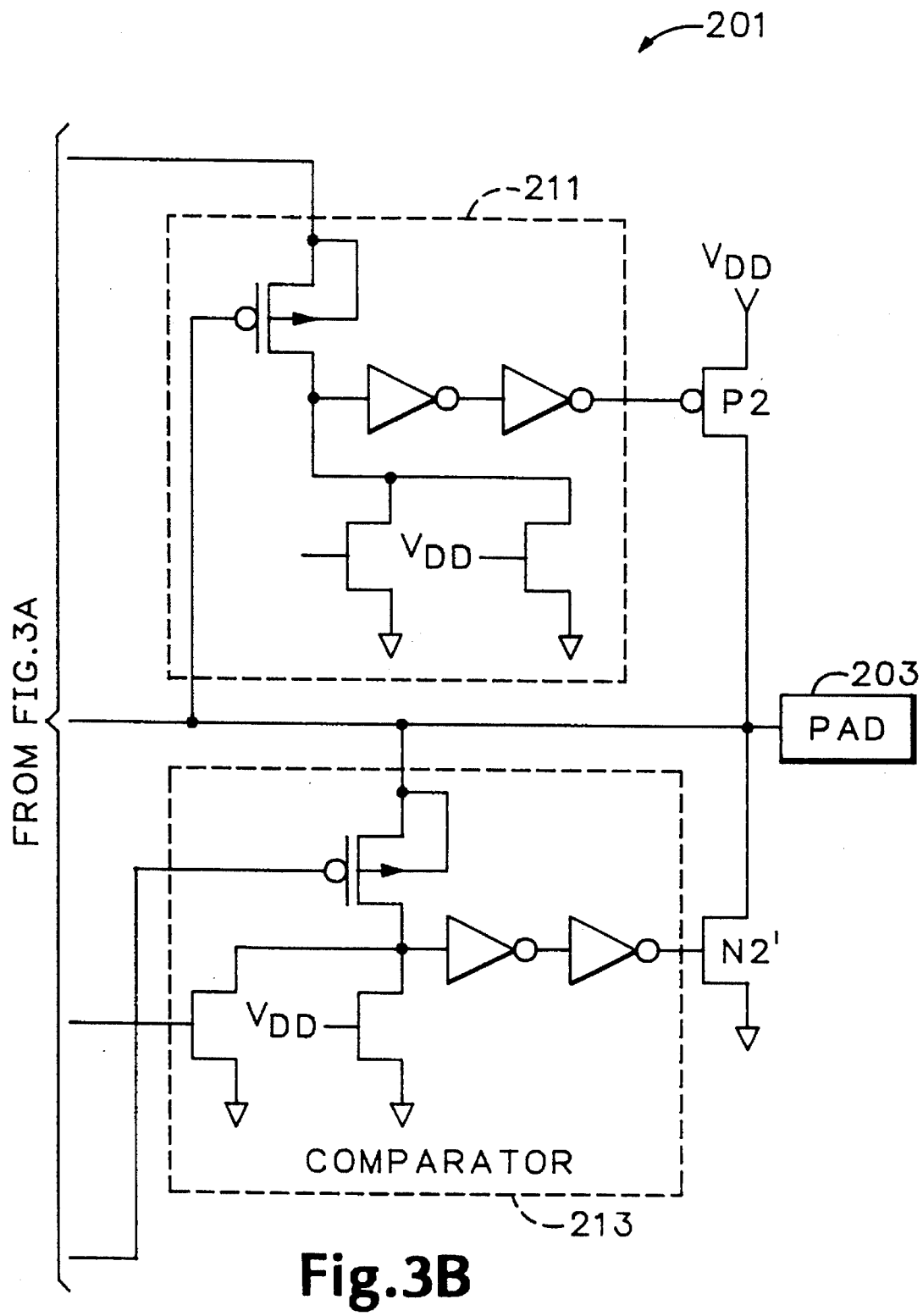

It will be recognized by a person skilled in the art that the present invention as just described can be implemented in a variety of circuit designs. While the embodiment as shown in FIG. 2 is designed in P/N-type logic, an alternative embodiment, shown in FIG. 3A–B is designed in N-type logic.

A typical output driver (e.g., FIG. 1), of comparable speed pad LOW to HIGH transition (at t=50.0) and HIGH to LOW transition (at t=100.0) is shown in FIG. 4A where waveforms 1, 2, and 3 are pad signal transition waveforms for loads of 20pF, 75pF, and 150pF, respectively, and waveform 4 is the DATA output signal transition at pad. Ground current is shown in FIG. 4B. Output waveforms in accordance with the present invention are shown in FIGS. 4C and 4D.

In FIG. 4A, note that for different loads at t=50 when the DATA signal 4 goes from LOW to HIGH, the pad voltage 1, 2, 3 lags in transition and that the pad transition is slower with each increasing load capacitance, where pad 3 has the highest capacitive load. At t=100 when the DATA signal 4 goes from HIGH to LOW, there is not only a differing lag for each increasing load, but also a significant ringing for lower capacitance loads when the pad reaches the supply limit. In FIG. 4B, note that a very sharp current transition, di/dt, occurs at t=100+(see arrow 400). This quick change in current is a source of electromagnetic interference (EMI).

Now compare FIG. 4C and 4D for the present invention. While in FIG. 4A the typical output driver showed three disparate rise times from LOW to HIGH, FIG. 4C shows that each of the pads reach a HIGH at approximately t=60.0, or about ten nanoseconds following the DATA signal switch. Similarly, in a HIGH to LOW transition, FIG. 4A shows a different fall time for each pad dependent upon the load. It should also be noted that with the present invention, there is no ringing at t=100+whereas the prior art driver exhibits significant settling difficulty.

Moreover, in comparing the ground current waveforms, note that where the prior art device shows a rapid di/dt from zero to a peak of three hundred milliamps (FIG. 4B at t=100.1 to 100.25) which leads to undesirable EMI, the present invention exhibits a changing slope over a longer time (FIG. 4D at t=100.1 to 100.7) and peaks at only two hundred seventeen milliamps.

Thus, a load adaptive pad driver has been demonstrated which not only compensates for varying loads on the output pads of a particular chip, but also decreases EMI and inductive bouncing of the pad signal at the transition time. The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. Apparatus for driving an integrated circuit output pad in response to a data output signal that switches between a first data signal having a first predetermined value and second data signal having a second predetermined value, said output pad having a load connected thereto, comprising:

first driver means, having an input connected for receiving said data output signal and an output for transmitting said data output signal to said output pad such that said output pad switches from said first predetermined value to said second predetermined value and from said second predetermined value to said first predetermined value at a first driver means rate of transition at said output pad that is dependent upon said load;

signal generator means for generating a predetermined reference signal having a slope such that said slope is positive-going when said data output signal switches with a positive-going data output signal transition and said slope is negative-going when said data output signal switches with a negative-going data output signal transition, said signal generator means having an input connected to trigger said predetermined reference signal in response to each data output signal switch and an output;

comparator means, having a first input connected to said output of said signal generator means and a second input coupled to said first driver means, for comparing said slope of said predetermined reference signal to said first driver means rate of transition of said data output signal at said output pad during a transition between said first and second predetermined values; and second driver means, having an input coupled to said comparator means and an output coupled to said output pad, for driving said output pad at a rate dependent upon said predetermined reference signal when said first driver means rate of transition of said data output signal at said output pad during a transition between said first and second predetermined values is slower than said slope of said reference signal.

2. The apparatus as set forth in claim 1, further comprising:

said signal generator means generating said predetermined reference signal such that said slope rate has a predetermined constant slope which is a function of process, voltage range, and operating temperature range variables of said integrated circuit.

3. The apparatus as set forth in claim 1, further comprising:

said first driver means controlling a switch in the data output signal at said output pad when said comparator means determines said slope of said predetermined reference signal is substantially the same as the first driver means rate of transition between said first and second predetermined values.

4. Apparatus for driving an integrated circuit output pad responsive to integrated circuit output enable signals combined with data output signals which switch at a known transition rate between two digital logic states represented by a first predetermined data output signal level and a second predetermined data output signal level, respectively, comprising:

first output driver circuitry, having
an input for receiving said data output signals from said integrated circuit,
a first output driver device, connected to said input and having a first output driver device output, for providing a first predetermined pad switching signal to an output pad when said data output signal switches from said first predetermined data output signal level to said second predetermined data output signal level, a second output driver device, connected to said input and having a second output driver device output, for providing a second predetermined pad switching signal to an output pad when said data output signal switches from said second predetermined data output signal level to said first predetermined data output signal, and an output section, including a series resistor having an input connected to said first output driver device output and said second output driver device output and an output connected to said output pad, for transmitting said predetermined switching signals to said output pad, respectively;

signal generator circuitry, having a first signal generator for generating a first reference signal having a positive-going slope, said first signal generator having an input for receiving an output enable signal from said first output driver device to trigger generation of said first reference signal when said data output signal is a positive going signal transition, and a second signal generator for generating a second reference signal having a negative-going slope, said second signal generator having an input for receiving an output enable signal from said second output driver device to trigger generation of said second reference signal when said data output signal is a negative going signal transition;

comparator circuitry, having a first comparator, having a first comparator first input connected to said first signal generator, a first comparator second input connected to said resistor output, and a first comparator output, and a second comparator, having a second comparator first input connected to said second signal generator, a second comparator second input connected to said resistor output, and a second comparator output; and a second output driver circuitry, having a third output driver device, having an input connected to said first comparator output and an output connected to said output pad, such that said third output driver device drives a transition at said output pad based on said first signal generator reference signal when said positive-going slope of said reference signal is faster than the first output driver circuitry first output driver device first predetermined pad switching signal transition, and a fourth output driver device, having an input connected to said second comparator output and an output connected to said output pad, such that said fourth output driver device drives a transition at said output pad based on said second signal generator reference signal when said negative-going slope of said reference signal is faster than the first output driver circuitry second output driver device second predetermined pad switching signal transition.

5. The apparatus as set forth in claim 4, further comprising:

each said signal generator is adapted to generate said reference signals in conformity with a bias level determined from predetermined fabrication process, operating voltage range, and operating temperature range variables of said integrated circuit.

6. The apparatus as set forth in claim 4, further comprising:

said first output driver circuitry controls a switch in the data output signal at said output pad when said comparator circuitry determines a slope of a reference signal generated by said signal generator circuitry is substantially the same as said known transition rate.

\* \* \* \* \*